(12) United States Patent
Tan et al.

(10) Patent No.: US 10,312,890 B2
(45) Date of Patent: Jun. 4, 2019

(54) PULSE POWER DEVICE BASED ON ANNULAR CERAMIC SOLID STATE LINE

(71) Applicant: INSTITUTE OF APPLIED ELECTRONICS, CAEP, Sichuan (CN)

(72) Inventors: Jie Tan, Sichuan (CN); Min Luo, Sichuan (CN); Peng Wang, Sichuan (CN); Qiang Kang, Sichuan (CN); Fei Xiang, Sichuan (CN); Guangyao Luo, Sichuan (CN); Xiaoliang Yang, Sichuan (CN)

(73) Assignee: INSTITUTE OF APPLIED ELECTRONICS, CAEP, Sichuan (CN)

( * ) Notice: Subject to any disclaimer, the term of this patent is extended or adjusted under 35 U.S.C. 154(b) by 305 days.

(21) Appl. No.: 15/325,257

(22) PCT Filed: Jul. 24, 2015

(86) PCT No.: PCT/CN2015/085020
§ 371 (c)(1),
(2) Date: Jan. 10, 2017

(87) PCT Pub. No.: WO2016/011972
PCT Pub. Date: Jan. 28, 2016

(65) Prior Publication Data
US 2017/0194951 A1    Jul. 6, 2017

(30) Foreign Application Priority Data

Jul. 25, 2014  (CN) .......................... 2014 1 0356613
Jul. 25, 2014  (CN) ..................... 2014 2 0412896 U

(51) Int. Cl.
*H03K 3/53* (2006.01)
*H03K 5/04* (2006.01)
*H01H 33/64* (2006.01)

(52) U.S. Cl.
CPC ............... *H03K 3/53* (2013.01); *H01H 33/64* (2013.01); *H03K 5/04* (2013.01)

(58) Field of Classification Search
CPC ....... F41H 13/0093; F42B 12/36; H03K 3/53; H03K 5/04; H03K 3/80; H03K 3/0231; H03K 3/78; H03K 3/84; H01H 33/64
(Continued)

(56) References Cited

U.S. PATENT DOCUMENTS 4,430,577 A * 2/1984 Bouquet ................ H03K 3/537
                                                       307/108
4,871,925 A * 10/1989 Yamauchi ........... H01F 1/15308
                                                       307/106
(Continued)

FOREIGN PATENT DOCUMENTS

| CN | 102983773   | 3/2013  |
| CN | 103475255   | 12/2013 |
| CN | 203747767 U | 7/2014  |
| CN | 104135250   | 11/2014 |
| CN | 204013444 U | 12/2014 |

OTHER PUBLICATIONS

International Search Report & Written Opinion dated Oct. 23, 2015 from corresponding International PCT Application No. PCT/CN2015085020, 10 pages.

*Primary Examiner* — Rexford N Barnie
*Assistant Examiner* — Terrence R Willoughby
(74) *Attorney, Agent, or Firm* — Innovation Capital Law Group, LLP; Vic Lin

(57) ABSTRACT

A pulse power device based on an annular ceramic solid state line. The pulse power device comprises several pulse forming lines (2), two charging inductors (1), and several (Continued)

gas switches that are connected as a whole based on Marx voltage superposition. The pulse forming lines (2) are annular pulse forming lines (2), and the annular surface of each annular pulse forming line (2) is provided with one gas switch. The annular pulse forming lines (2) are successively superposed together to form a column structure through the gas switches. Each charging inductor (1) passes through the inner ring of each annular pulse forming line (2) to be disposed inside the column structure. An annular insulation plate (3) is disposed between every two annular pulse forming lines (2).

9 Claims, 2 Drawing Sheets

(58) Field of Classification Search
USPC .......................................................... 331/173
See application file for complete search history.

(56) References Cited

U.S. PATENT DOCUMENTS

| | | | | |
|---|---|---|---|---|
| 5,412,254 | A * | 5/1995 | Robinson | H03K 3/537 307/106 |
| 5,656,873 | A * | 8/1997 | O'Loughlin | H03K 3/537 307/106 |
| 6,026,099 | A * | 2/2000 | Young | H01S 4/00 372/25 |
| 6,281,603 | B1 * | 8/2001 | Garner | H01F 19/08 307/104 |
| 2005/0088044 | A1 * | 4/2005 | Kekez | H02N 11/004 307/108 |
| 2008/0284276 | A1 * | 11/2008 | McDonald | B82Y 30/00 310/308 |
| 2009/0224610 | A1 * | 9/2009 | Fuks | F41H 13/0093 307/108 |
| 2011/0006614 | A1 * | 1/2011 | Baird | H03K 3/45 307/106 |

* cited by examiner

PULSE POWER DEVICE BASED ON ANNULAR CERAMIC SOLID STATE LINE

BACKGROUND

Technical Field

The invention relates to power pulse, and more particularly, to a rectangle pulse high voltage generating device. The invention can be applied in the fields related to photoflash photography, high-power microwave, high-power frequency radio, materials research and so on.

Related Art

Currently, miniaturizing a high-power pulse power source becomes a major trend in the technical development. As the electron beam used in the researches related to HPM, X-ray, laser and other aspects have higher requirements, there is a serious need for developing compact pulse power sources. Therefore, researches of rectangle pulse power sources related to voltage adders based on Marx become a hot research topic both at home and abroad. Recently, several methods have been developed for implementing an output for the voltage adder by using the Marx technique, these methods include: 1. generating a pulse by PFN (Pulse Forming Network); 2. generating a pulse by using the high voltage transmission lines; and 3. generating a pulse by a line-type plate solid-state line. Although some miniaturized pulse power sources have been developed based on the methods mentioned above, a gap remains between the power-volume ratios of these devices and the actual requirements.

With regard to the method 1 mentioned above, although the pulses generated by PFN has some advantages in the aspect of generating long pulses, the pulse front edge and the pulse rare edge will get longer as using a lumped parameter capacity and a lumped parameter inductor about a hundred nanoseconds later. Moreover, as the volumes of the existing high-voltage ceramic capacities or the film capacities get larger, it needs multi stage capacitor and inductor to produce better flat-top pulse voltage, which leads to bigger and bigger volume of the whole pulse network. With regard to method 2 mentioned above, when the pulse is generated by using the high voltage transmission lines, as the dielectric constant is relatively low (at present, the well-known deionized water has the highest dielectric constant, i.e. 81), the step of generating a high voltage pulse having a certain width requires an extra long electrical length, and this method is not good for miniaturizing a pulse power device. With regard to the method 3 mentioned above, a higher dielectric constant can be obtained by using the line-type plate solid line, however, as the line-type plate solid line generates the pulse based on the reflection principle thereof, the quality of the waveform is degraded due to the reflection in the transmission; as the existing pulse devices are connected to the switch by lead wires, a higher loop-inductor which is not good for forming a high-voltage pulse at the front edge of a fast pulse would be generated; meanwhile, in this case, the structural design would be complicated as multi-stages Marx are superimposed.

Nowadays, an annular solid-state pulse forming line has been developed by the same inventors of the present invention, and the corresponding application was filed with a filing number of CN201420085748 (Publication No. CN203747767U). Although it improves the compact and miniaturized design of the solid-state pulse forming line comparing with the line-type plate solid-state pulse line, the filed intensity of the tips of the silvering layer at the two ends of an opening will be increased than other areas and it results in a technical problem of point discharge. Meanwhile, the increased filed intensity might lead a breakdown of the ceramic material and a surface flashover. Furthermore, a voltage waveform reflection of the plate solid-state pulse forming line would degrade the waveform.

SUMMARY

Regarding to the pulse power devices used to generate high voltage provided in existing techniques, one technical issue to be solved is how to provide a miniaturize pulse power device, for generating a high voltage pulse output having a fast front edge, a compact type, a better wave-form and high power-volume ratio. This pulse power device can be used in the fields related to flash photographing, high-power microwaves, high power RF, materials researches and so on. Therefore, the present disclosure has an important social benefit and objective economic benefits.

An objection of the present disclosure is to provide a pulse power device based on annular ceramic solid lines, including a pulse generating section provided in a cylinder and a load section, wherein the pulse generating section and the load section are separated from each other hermetically by an insulating plate provided therebetween; the pulse generating section includes pulse forming lines, two charging inductors and a plurality of gas switches, wherein the pulse forming lines, the two charging inductors and the plurality of gas switches are connected as a single body based on a Marx voltage adder; the pulse power device, wherein, the pulse forming lines are annular pulse forming lines, an annular surface of each annular pulse forming line is provided with one gas switch electrode, thereby a switch is formed by two gas switch electrodes on two annular pulse forming lines adjacent to each other; the annular pulse forming lines are superimposed by the plurality of gas switches for forming a cylindrical structure, an inner ring through which the charging inductors passes is formed within the cylindrical structure, and an annular insulating plate is provided between each two annular pulse forming lines.

In the technology mentioned above, the each annular pulse forming line includes: a ceramic dielectric substrate having a ring shape and electrode layers, the electrode layers are enclosed rings, two electrode layers are provided on two annular surfaces of the ceramic dielectric substrate respectively, wherein the two electrode layers are concentric and have the same radius.

In the technology mentioned above, the one gas switch includes two electrodes, wherein one electrode is a copper plate and is directly welded on one electrode layer of the ceramic dielectric substrate having a ring shape, and another electrode is a screw with thread and is welded on another electrode layer of the ceramic dielectric substrate.

In the technology mentioned above, a nut is provided on the screw with thread and is configured to adjust a position.

In the technology mentioned above, the two electrodes of the two gas switches are aligned in a vertical direction.

In the technology mentioned above, the two adjacent annular insulating plates have different radiuses.

In the technology mentioned above, from a high-voltage output terminal to a charging input terminal, the radiuses of the annular insulating plates in odd-layers are more than the radiuses of the annular insulating plates in even-layers, and wherein edges of the annular insulating plates in odd-layer are provided with a circle of through holes.

In the technology mentioned above, all of the annular insulating plates are provided with openings, the openings toward the same direction.

In the technology mentioned above, the positions of the two gas switch electrodes on the two annular pulse forming lines adjacent to each other are corresponding to each other, and a pitch of the gas switches formed on the two adjacent annular pulse forming lines is adjusted by a nut.

According to the present disclosure, the technical issues including the degradation of the waveform due to the reflection in the transmission of the combination wave and the large filed intensity caused by the tips of the silvering layer on the ends of the openings, the technology disclosed in the present invention uses an annular ceramic solid-state pulse forming line with electrodes which is fully enclosed and completely silver coated. This annular ceramic solid-state pulse forming line is implemented by an electrode, which is formed by plating silver on two surfaces of an annular plate of the ceramic material in an enclosed manner. As no openings are provided, the problem of reflection can be eliminated. Here, comparing with a line-type plate solid-state pulse forming line which generates an expectant rectangle based on the reflection principle, an expectant rectangle high voltage pulse is generated based on the bidirectional transmission and the parallel output, the quality of the waveform can be improved and the front edge of the pulse can be enhanced. By this way, as the combination wave reaches the surface, the degradation of the waveform caused by the reflection can be prevented. Meanwhile, as there is no opening provided on the surface and there is no tip provided on the silver electrode of the surface, the uniformity of the electrical field can be improved and the possibility of the point discharge can be obviated. Moreover, by using the plating silver having an annular shape, the uniformity of the electrical field is improved, the voltage withstanding level of the entire solid-state pulse forming line is enhanced and the possibility of the surface flashover breakdown is reduced greatly.

According to the invention, two electrodes of the gas switch are directly welded on the two silver electrodes of the annular ceramic solid-state pulse forming line. Here, the two electrodes are implemented by a circular copper plate and a screw with thread respectively. In this case, by providing an electrode nut on the screw, the distance of the gas switch between the two annular ceramic solid-state pulse forming lines can be adjusted by adjusting the electrode nut when the annular ceramic solid-state pulse forming lines are superimposed based on Marx. By this way, the gas switches and the solid-state pulse forming lines are configured as a single device, and the connect lines between the pulse forming lines and the gas switches can be reduced. In this case, the connecting inductance of each switch is reduced and the circuit inductance of the entire circuit is reduced significantly, thus the reduction of the circuit induce can improve the front edge of the pulse efficiently, and the quality of the output high voltage pulse can be optimized.

According to the present disclosure, all of the annular pulse forming lines, the gas switches, and the charging inductors are arranged along an axis in a stacking manner, thus the gas switches are configured to be arranged among the annular pulse forming lines tightly, and two sets of charging inductors are configured to be provided in the space enclosed by these annular solid-state pulse forming lines. As the solid pulse forming lines and the outer cylinder are co-axial, filed distributing between the high voltage terminal of the annular pulse forming lines and the outer cylinder is more uniform. By this way, the risk and the possibility of the point discharge are reduced significantly. Under a certain insulating voltage, the required insulating voltage can be reduced sharply. By this way, a miniaturized design of the whole device is accomplished. At the same time, as the adder of the multiple-stage solid-state pulse forming lines is accomplished, the affect on the ambient electrical field of each forming line is weak, the problems such as the distortion of electrical fields are not easily generated. By this way, during the discharging of the combination wave, the affect on the discharging field caused by the ambient electrical field and the other solid pulse forming lines can be reduced. Therefore, the quality of the waveform of the output pulse is enhanced.

Therefore, according to the present disclosure, some beneficial effects include: as the pulse power system has a co-axial construction, the system is more compact. Comparing with the pulse power systems reported domestically and abroad, the power-volume ratio according to the present disclosure is improved by 50%. At the same time, by using the co-axial construction, the electrical distribution is more uniform, and the possibility of the high-voltage breakdown caused by the voltage distortion could be reduced. Moreover, as the pulse generating unit is implemented by the annular pulse forming lines, a high voltage pulse having a fast pulse front edge could be output.

BRIEF DESCRIPTION OF THE DRAWINGS

The present disclosure will become more fully understood from the detailed description given herein below for illustration only, and thus are not limitative of the present disclosure, and wherein.

Figure 1:
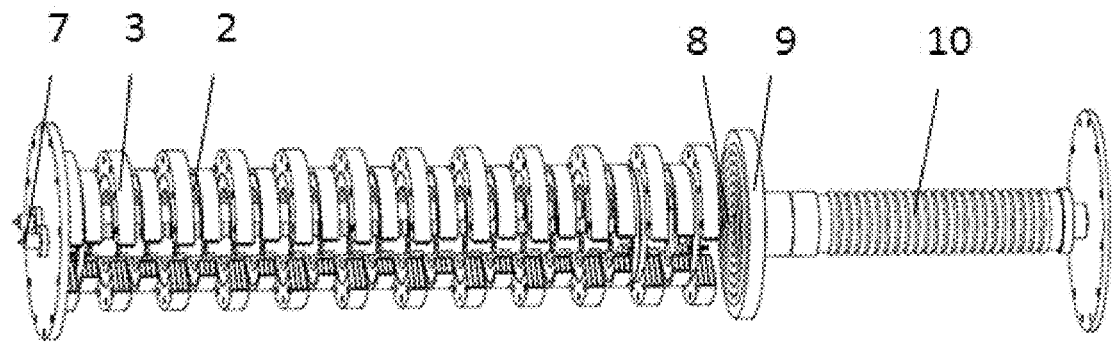
FIG. 1 is a structure diagram of the device according to the present disclosure.

The numbers and the letters in the figures indicate the corresponding part as the follow:

1 charging inductor
2 annular pulse forming line
3 annular insulating plate
4 grounding line
5 nut
6 copper plate
7 charging input terminal
8 high-voltage output terminal
9 insulating plate
10 load
11 electrode layer
12 ceramic dielectric substrate

DETAILED DESCRIPTION

Except for the mutually exclusive technical features and/or the mutually exclusive steps, all of the technical features, the methods or steps provided in the present disclosure can be combined in any form.

As illustrated by FIG. 1, according to the present disclosure, a pulse power device based on annular ceramic solid lines includes a pulse generating section provided in a cylinder and a load section provided in a cylinder as well, wherein the two sections are separated from each other hermetically by an insulating plate 9 between the two sections. The insulation of pulse generating section is implemented by inflating $SF_6$ (or the mixture of $SF_6$ and $N_2$), the insulation of the load section is implemented by introducing transformer oil, and the two insulating mediums are separated from each other by an organic glass insulating plate interposed therebetween. Here, an outer cylinder of the device is not illustrated. The pulse generating section is taken as the main body of the device, and this pulse generating section includes: annular pulse forming lines 2, gas switches, annular insulating plates 3, charging inductors 1 and so on.

Figure 2:
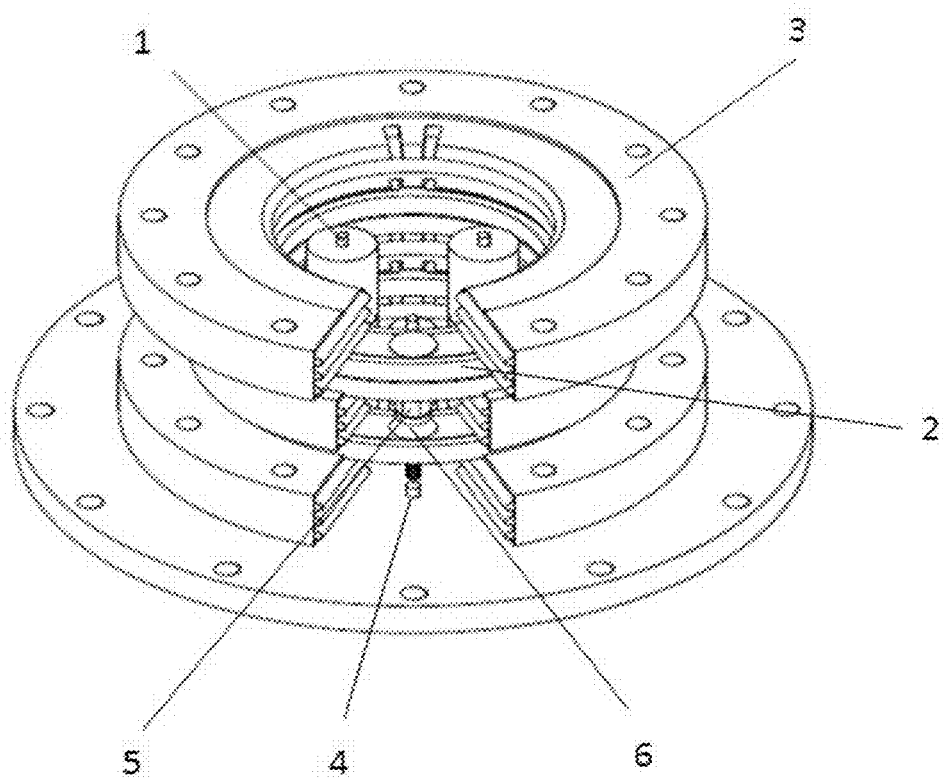
FIG. 2 is a local structure diagram of an pulse forming line according to the present disclosure.

As illustrated by FIG. 2, all of the annular pulse forming lines 2, the gas switches, and the charging inductor 1 are arranged along one axis in a stacking manner, wherein the gas switches are configured to be arranged among the annular pulse forming lines 2 tightly. Two sets of charging inductors 1 are configured to be provided in the space enclosed by these annular pulse forming lines 2. Except for the first stage and the last stage of the annular pulse forming lines 2, the other stages thereof are connected in series. The load 10 is implemented by a water resistance or a diode. For fastening these annular pulse forming lines tightly, some through holes are provided on the peripheries of the annular insulating plates 3, thus screws with threads are capable of being inserted into these through holes. By this way, the annular pulse forming lines 2 are compressed tightly by a fastening nut from the uppermost annular pulse forming line layer in a layer by layer way. During the operation of the device according to the present disclosure, the charging input terminal 7 of the charging power is connected to a charging inductor 1. Thereby, these annular pulse forming lines could be charged to a predetermined voltage by the charging inductor 1 in parallel. Thus, when these switches are configured to be turned on as voltage is higher than the puncture voltage of these gas switches, thus a high voltage pulse is generated by superimposing the voltage of each annular pulse forming line 2, and thereby the load 10 is discharged. By this way, the high voltage pulse could be output to the load 10 via a high-voltage output terminal 8. During this charging process, the charging inductor 1 is regarded as short, for forming a separation between forming line units and forming a separation between the forming lines and the power.

The charging inductor 1 is surrounded by these annular solid-state pulse forming lines 2, for eliminating the effect of the electric field distortion and for obtaining a compact and miniaturized design. Here, nylon or organic glass is functioned as an insulating medium between two annular solid state pulse forming lines. Meanwhile, the insulating thickness is determined based on a voltage applied on the two ends of the annular solid-state pulse forming line and is determined based on a dielectric strength of $SF_6$ gas per unit distance. The gas switch can be implemented by the two copper electrodes provided on the two end surfaces of two adjacent annular solid-state pulse forming lines. As the whole pulse generating section is full of $SF_6$ gas having a certain pressure, this gas is taken as the gas switch and is taken as the insulating medium of the pulse forming line.

Figure 3:
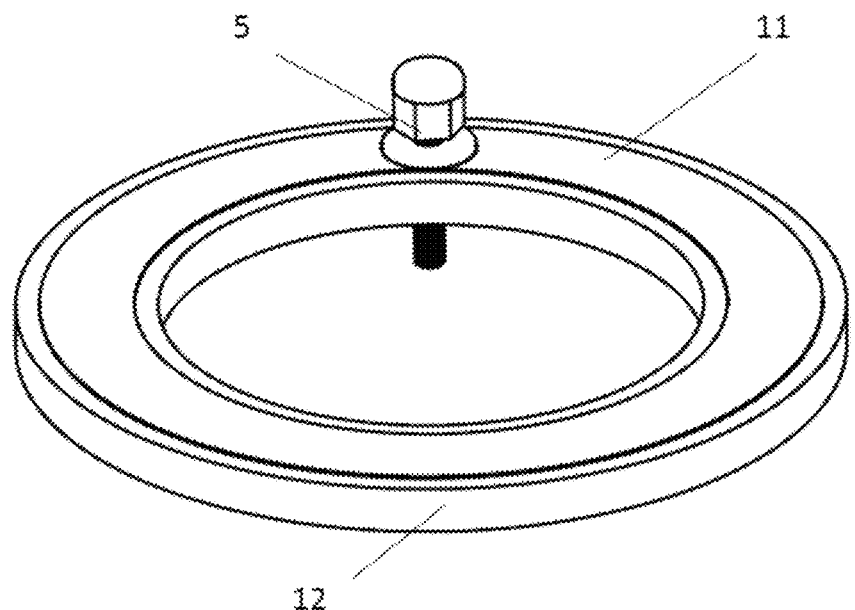
FIG. 3 is a structure diagram of an annular pulse forming line according to the present disclosure.

As illustrated by FIG. 3, an annular pulse forming line 2 includes a ceramic dielectric substrate 12 having a ring shape. Each of the two annular surfaces of the ceramic dielectric substrate 12 is provided with one electrode layer 11 having a ring shape respectively, wherein these electrodes are formed by plating sliver. The ceramic dielectric substrate 12 is a sintered ceramic plate and the width between the two end surfaces of one annular electrode layer is less than the thickness of the ceramic plate (5 mm), so as to increase the breakdown length of the electrode and prevent a surface flashover breakdown. Meanwhile, for decreasing the inductance, the gas switches are welded on the electrode layers 11 of the annular pulse forming line 2 directly. The gas switch has two electrodes, wherein one electrode is implemented by a copper plate 6 welded on the electrode layer 11, and the other electrode is implemented by a screw with thread and welded on another electrode layer 11 of the annular pulse forming lines 2. In this case, the two electrodes of the gas switch are aligned in the vertical direction.

Figure 4:
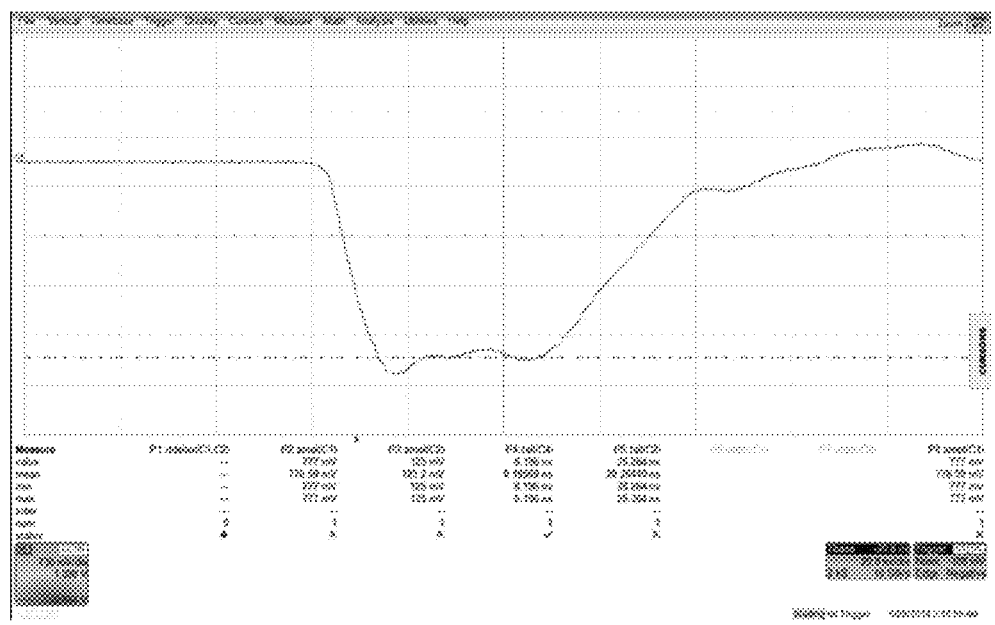
FIG. 4 is a typical waveform of an output voltage.

As illustrated by FIG. 4, according to the present disclosure, the waveforms obtained in experiments include good rectangle pulse outputs, a full width at half-maximum (FWHM) about 60 ns, a front edge about 8.2 ns and a voltage efficiency more than 90% with matched load.

The embodiments provided above are not intended to limit the present invention. And the scope of the present invention could be extended to cover the new technical features disclosed in the present disclosure and any new combination thereof. Meanwhile, it is intended that the present invention cover new methods, processes or the new combination within the scope of the appended claims and their equivalents.

What is claimed is:

1. A pulse power device based on annular ceramic solid-state lines, including a pulse generating section provided in a cylinder and a load section provided in a cylinder, the pulse generating section and the load section are separated from each other by an insulating plate provided therebetween; the pulse generating section includes a plurality of pulse forming lines, two charging inductors and a plurality of gas switches, and the pulse forming lines, the two charging inductors and the gas switches are connected as a single body based on a Marx voltage adder; wherein, the pulse forming lines are annular pulse solid-state forming lines, each one annular surface of each annular pulse solid-state forming line is provided with one gas switch electrode, thereby a switch is implemented by two gas switch electrodes on two annular pulse forming lines adjacent to each other;

the annular pulse forming lines are superimposed by the gas switches for forming a cylindrical structure;

the charging inductors pass through an inner ring of the annular pulse forming lines and are configured within the cylindrical structure, and an annular insulating plate is provided between each two annular pulse forming lines.

2. The pulse power device based on annular ceramic solid-state lines according to claim 1, wherein, the annular pulse forming line includes: a ceramic dielectric substrate having a ring shape and electrode layers, the electrode layers are configured as closed loop of rings, two electrode layers are provided on two annular surfaces of the ceramic dielectric substrate respectively, and the two electrode layers are concentric and have a same radius.

3. The pulse power device based on annular ceramic solid-state lines according to claim 1, wherein, the gas switch includes two electrodes, one electrode is a copper plate and is directly welded on one of the electrode layers of the ceramic dielectric substrate having a ring shape, and the other electrode is a screw with thread and is welded on the other one of the electrode layers of the ceramic dielectric substrate.

4. The pulse power device based on annular ceramic solid-state lines according to claim 3, wherein, the screw with thread is provided with a nut, and the nut is configured to adjust position.

5. The pulse power device based on annular ceramic solid-state lines according to claim 3, wherein, a welding position for one of the electrodes of one of the gas switches is aligned in a vertical direction with a welding position for the other one of the electrodes of the gas switch.

6. The pulse power device based on annular ceramic solid-state lines according to claim 1, wherein, the two adjacent annular insulating plates have different radiuses.

7. The pulse power device based on annular ceramic solid-state lines according to claim 6, wherein, the radiuses of annular insulating plates in odd-layers are greater than the radiuses of annular insulating plates in even-layers from a high-voltage output terminal to a charging input terminal, and edge of each one of the annular insulating plates in odd-layer is provided with a circle of through holes.

8. The pulse power device based on annular ceramic solid lines according to claim 7, wherein, each of the annular insulating plates is provided with an opening toward the same direction.

9. The pulse power device based on annular ceramic solid-state lines according to claim 4, wherein, the positions of the two gas switch electrodes on the two annular pulse forming lines adjacent to each other are corresponding to each other, and a pitch between the gas switches formed on the two adjacent annular pulse forming lines is adjusted by a nut.

* * * * *